United States Patent
Danilatos

(10) Patent No.: US 6,809,322 B2
(45) Date of Patent: Oct. 26, 2004

(54) ENVIRONMENTAL SCANNING ELECTRON MICROSCOPE

(76) Inventor: Gerasimos Daniel Danilatos, 26 Hastings Pole, Bondi Beach, NSW 2026 (AU)

(*) Notice: Subject to any disclaimer, the term of this patent is extended or adjusted under 35 U.S.C. 154(b) by 8 days.

(21) Appl. No.: 10/343,638

(22) PCT Filed: Aug. 3, 2001

(86) PCT No.: PCT/AU01/00943
§ 371 (c)(1),
(2), (4) Date: Feb. 3, 2003

(87) PCT Pub. No.: WO02/15224
PCT Pub. Date: Feb. 21, 2002

(65) Prior Publication Data
US 2003/0168595 A1 Sep. 11, 2003

(30) Foreign Application Priority Data
Aug. 11, 2000 (AU) .......................... PQ 9322

(51) Int. Cl.$^7$ .............................................. H01J 49/24
(52) U.S. Cl. .................. 250/441.11; 250/289; 250/310; 250/396 R
(58) Field of Search ........................... 250/441.11, 289, 250/310, 396 R

(56) References Cited

U.S. PATENT DOCUMENTS

| | | | |
|---|---|---|---|
| 4,596,928 A | | 6/1986 | Danilatos ..................... 250/307 |
| 4,785,182 A | | 11/1988 | Mancuso et al. ............ 250/310 |
| 4,823,006 A | | 4/1989 | Danilatos et al. ........... 250/310 |
| 4,897,545 A | * | 1/1990 | Danilatos ..................... 250/310 |
| 4,992,662 A | | 2/1991 | Danilatos ..................... 250/310 |
| 5,362,964 A | * | 11/1994 | Knowles et al. ............ 250/310 |
| 5,485,008 A | | 1/1996 | Taylor, Jr. ..................... 250/310 |
| 5,945,672 A | | 8/1999 | Knowles et al. ............ 250/310 |
| 6,396,064 B1 | * | 5/2002 | Danilatos ............... 250/441.11 |

FOREIGN PATENT DOCUMENTS

EP 0 022 356 1/1981 ............ H01J/37/28

OTHER PUBLICATIONS

Derwent Abstract Accession No. 99–015205/02, Class V05, JP 10283962A (Nikon Corp) Oct. 23, 1998 abstract.

* cited by examiner

*Primary Examiner*—Nikita Wells
(74) *Attorney, Agent, or Firm*—Michael D. Bednarek; Shaw Pittman LLP

(57) ABSTRACT

The invention provides for a scanning electron or ion beam instrument capable of transferring the beam from a high vacuum chamber (8) into a high pressure chamber (5) via aperture (1) and aperture (2). The beam is deflected and scanned by coils (3) generally positioned between apertures (1) and (2). The amplitude of deflection of the beam over a specimen placed inside chamber (5) is substantially larger than the diameter of aperture (1). Leaking gas through aperture (1) is removed via port (7) by appropriate pumping apparatus. The size of aperture (1) is such that the pressure in chamber (6) combined with the supersonic jet and shock waves naturally forming therein do not result in catastrophic electron beam loss in chamber (6). The addition of appropriate detection means result in an instrument characterised by superior performance over prior art by way of better field of view at low magnification, better vacuum system and improved detection and imaging capabilities.

21 Claims, 2 Drawing Sheets

ENVIRONMENTAL SCANNING ELECTRON MICROSCOPE

TECHNICAL FIELD

The present invention relates to the technical field of electron and ion microscopy as well as to electron and ion beam technologies in general.

BACKGROUND ART

Electron microscopes in general and scanning electron microscopes (SEM) in particular use an electron beam probe to examine specimens. The electron beam requires a good vacuum where it is generated by an electron gun and propagated through focussing lenses all the way to the specimen. In addition, many of the detection means used to detect the emerging signals from the beam-specimen interaction also require a vacuum condition in which the specimen is severely limited. In the past, this meant that only dehydrated specimens could be used. In addition, because the electron beam delivers an electric current, the specimen should generally have a conductive surface to prevent accumulation of charge that hinders normal operation of the instrument. This meant that generally an insulating surface could not be examined. However, the more recent technology of an environmental scanning electron microscope (ESEM) has made it possible to examine specimens in a gaseous environment. The presence of a gaseous envelope around the specimen at sufficient pressure makes it possible to maintain moist conditions so that hydrated specimens can be observed in their natural state. Also, the ionised gas dissipates the electron beam current away from the surface of insulating specimens and, therefore, these specimens need not have the pre-treatments conventionally used to render their surface conductive. Additionally, the gas is used as detection medium to detect the signals generated in the gaseous envelope around the specimen. Such signals are usually the secondary electrons and the backscattered electrons from the specimen, which ionise the surrounding gas and become detected by appropriate means.

This prior art is comprehensively described by U.S. Pat. No. 4,596,928, DE Patent No. 0 022 356 B1, U.S. Pat. No. 4,992,662, U.S. Pat. No. 4,785,182, U.S. Pat. No. 4,823,006, U.S. Pat. No. 4,897,545 and U.S. Pat. No. 5,945,672.

One basic feature of this technology is the use of at least two pressure limiting apertures (PLA) to separate the high vacuum of the electron optics column (where the beam is generated and propagated) from the high pressure environment of the specimen chamber. The gas leaking through the first of the apertures, PLA1, is quickly pumped out of the system before any significant amount of gas leaks through the second of the apertures, PLA2, into the vacuum of the electron optics column.

Now, despite the many and important advantages created with the advent of ESEM over SEM, this technology has its own limitations which are amenable to improvement.

One particular limitation in the ESEM is with respect to the permissible field of view described herein. In a SEM operating totally in vacuum, the electron beam is focussed into a very small probe, which is scanned in a raster form over the specimen area observed, in a similar manner as in an ordinary television set (i.e. a cathode ray tube—CRT). However, the scanned raster over the specimen is very small in absolute terms, which is of the order of a few mm or much less as opposed to the large screen of an ordinary television set. The very small scanned raster is possible to obtain because of the extremely fine electron probe used, which allows, for example, one thousand lines to be stacked in the raster. Through appropriate electronics, a synchronous raster in a CRT creates an image corresponding point by point to the variation of signals emanating from the scanned specimen surface. The ratio of the size of the image on the CRT screen over the size of specimen raster defines the magnification. Thus, the maximum magnification corresponds to the minimum raster on the specimen possible to scan without distortion, noise or blurring (defining the ultimate resolving power of the instrument). At the other extreme, the maximum scanned area over the specimen defines the largest possible field of view (corresponding to the lowest magnification). The largest field of view possible is a useful specification of a microscope, because it is usual to survey a large area before a particular feature of interest is magnified. Now, the maximum field of view in an ESEM is limited by the size of the first pressure limiting aperture used. Usually, a 0.5 mm diameter first pressure limiting aperture is used and hence the field of view is much smaller than in a SEM, where there is no pressure limiting aperture and the field of view is limited by other electron optical considerations, but nevertheless being superior to that of an ESEM.

The limited field of view in an ESEM is a consequence of the use of two pressure limiting apertures in a position, relative to the scanning coils, that creates a collimating effect on the probe within the scanned cone.

Because this is an important limitation, attempts have been disclosed in prior art to rectify the problem. U.S. Pat. No. 5,362,964 describes two approaches. According to the first approach, light optics is used to obtain a light image at low magnification with lenses and mirrors located below the first pressure limiting aperture. With appropriate electronics controls, the operator switches between the light image and electron image at different magnifications. Whilst this provides one solution to the problem, it is characterised by considerable cost, cumbersome usage and technological complexity.

According to the second approach of the same U.S. Pat. No. 5,362,964, a third scan coil is positioned between the two pressure limiting apertures to bend the electron beam below the first pressure limiting aperture beyond the boundary of the first pressure limiting aperture. This should be a better solution than the first because of the apparent simplicity. However, the latter solution is difficult in reality to achieve, because the third scan coil has limited space to operate between the two pressure limiting apertures, it requires a high current and the resulting multi-deflection system is difficult to materialise. This prior art has not yet been implemented on any commercial instrument yet. The lack of such an otherwise useful system from all commercial ESEMs available to date is indicative of the difficulties involved. Notwithstanding the reasons for such a lack, the present invention discloses a much simpler solution to remedy the limited field of view of an ESEM.

Another device of U.S. Pat. No. 5,485,008 also aims at improving the limited field of view in an ESEM. This attempt further demonstrates the need to overcome the disadvantage of field of view. However, a person skilled in the art of ESEM, gas dynamics and electron optics immediately recognises that the device of this patent does not readily achieve the aim either. The increase of the aperture size at the expense of pumping volume and all other suggested improvements would come at a high cost, they would create other technical problems to the system, and no technical reports are known showing the feasibility, implementation, or use of this device. Notwithstanding the reasons for the lack of use of the device as described in this patent, it will be appreciated that the present invention discloses a radically different solution from this device with regard to the remedy of the limited field of view of an ESEM.

Another limitation of an ESEM is that it generally requires large pumping capacity between the apertures as the first pressure limiting aperture is increased in order to increase the field of view.

A further limitation of an ESEM is that it generally requires high accelerating voltage in order to avoid the large electron beam losses taking place above the first pressure limiting aperture where a supersonic gas jet and shock waves inevitably form. A large first pressure limiting aperture creates a catastrophic amount of electron scattering at low accelerating voltage.

There is also a class of SEM instruments, which allow low pressure gas of the order of 100 Pa. This class of SEM is often referred to as low vacuum or variable pressure SEM. This is achieved by generally providing increased pumping capacity above the last aperture placed in the electron optics column generally several millimeters above the end of the final lens. This last electron optical aperture is generally of a small diameter to limit the amount of gas leaking into the electron optics column, but the field of view is maintained generally large because the position of the aperture is the same as in a conventional SEM. The placement of the last aperture several millimeters above the bottom of the final lens has been dictated by electron optical considerations of the conventional SEM. This location of the pressure limiting aperture has prevented this class of SEMs to operate at a substantially higher pressure as the ESEM does. In particular, the beam undergoes a catastrophic amount of losses in the travel distance between the aperture and bottom of final lens and no useful beam spot can ever reach a specimen placed even further below the final lens at substantial gas pressure as used in an ESEM. However, this class of SEMs has been useful in the elimination of charge accumulation on insulating specimens, as the generally low gas pressure achieved is sufficient for this purpose. However, they cannot be used at substantial pressure or at low accelerating voltage, which are desired features in the examination of soft (i.e. low atomic number) or wet specimens.

The transition from the conventional SEM and low vacuum SEM, which are characterised by a large field of view at low magnifications, to all recent forms of ESEM has imposed certain limitations such as the limited field of view and increased pumping capacity.

OBJECT OF THE INVENTION

It is an object of the present invention to provide an improved device to substantially overcome or ameliorate the above mentioned disadvantages, and a further object to provide improved detection means in the gaseous environment of the specimen chamber.

DISCLOSURE OF THE INVENTION

The embodiments of the present invention relate to environmental scanning electron microscopes (ESEM) with improved field of view at low magnification, improved pumping capacity and improved detection in the gaseous environment.

In one aspect of the invention, there is disclosed a device using electron optical means for the generation and propagation of a focussed charged particle beam transferred via two apertures from a high vacuum chamber into a gaseous specimen chamber with an intermediate pressure chamber therebetween, said apertures being aligned along axis of said beam, and characterised in that: (a) said beam is deflected by a set of scanning coils positioned near axis of said beam; (b) all of said coils being substantially between said apertures; (c) amplitude of the deflection of said beam inside the specimen chamber is larger than the diameter of the aperture separating the specimen chamber from the intermediate chamber; (d) the aperture separating the specimen chamber from the intermediate pressure chamber is located substantially at the end of the electron optical means, or away from the end of the electron optical means to allow a specimen to be freely placed without obstruction at any distance from the aperture. Pumping means attached to the intermediate chamber allows operation at high specimen chamber pressure but such pumping means may be omitted for very low specimen chamber pressure work, for example, for suppression of specimen charging.

In the preferred embodiment, an improved environmental scanning electron microscope (ESEM) has an enlarged field of view at low magnification in contrast to prior art. The prior art of ESEM uses two pressure limiting apertures (PLA) to restrict the flow of gas from the specimen chamber into the vacuum of the electron optics column, where the electron beam is generated and propagated. A first pressure limiting aperture (PLA1) is usually placed near the end of the objective lens and a second pressure limiting aperture (PLA2) is placed near the principal plane of the same lens. The space between the two PLAs is pumped usually with a mechanical pump to accommodate the relatively large amount of gas flowing through the PLA1, so that only rough vacuum is maintained therein. The electron beam initially travels unobstructed in the vacuum of the electron optics, then it undergoes a limited number of scattering events in the rough vacuum of the space between the two PLAs and finally enters in the high pressure regime of the specimen chamber. Care is taken for the beam not to travel too far before it reaches the specimen, so that enough un-scattered electrons remain in the original probe spot to carry out scanning and imaging of the observed area in the usual manner. The shortest possible distance of beam travel in the high pressure chamber is achieved by placing the PLA1 at the end of the final lens. This is in contrast to the placing of a final aperture, as in the low vacuum SEMs, several mm above the end of the final lens, substantially at the principal plane of the lens, which creates an obstruction between the specimen and the aperture, and which increases the travel distance in the gas from the final PLA to the specimen thus creating a catastrophic scattering effect on the electron beam.

Any person skilled in the art of ESEM readily recognises that the distance between the two PLAs must be kept as short as possible to minimise the beam losses in the rough vacuum conditions. Furthermore, any person skilled in the art of ESEM recognises that the distance between the two apertures may not become arbitrarily small because the gas can flow from the first aperture directly into the second one in large quantities, which destroys the good vacuum condition of the electron optics column. Thus, a compromise distance between 6 and 15 mm has been successfully used in practice.

Now, the electron beam undergoes deflection in two mutually normal directions to achieve the square raster scanned over the specimen surface. This is usually obtained via a set of double deflection scan coils along the optical axis of the system somewhere inside the final (objective) lens.

Persons skilled in the art of electron optics are familiar with the details of this arrangement and it should be appreciated that the physical size of the scan coils does not allow them to be fitted between the two PLAs, but only above them as used in all prior art ESEM. The position of scan coils above both pressure limiting apertures is clearly shown in the cited prior art. As a result, the electron beam is scanned with an effective "rocking" or "pivot" point generally above said apertures, which limits the maximum amplitude of oscillation within their diameter creating a collimating effect. Even when the pivot point is located between the apertures, there again is a collimating effect of the two apertures. This collimating effect is responsible for the familiar "tunnel vision in the ESEM" at the low magnifications resulting primarily by the fact that all scan coils are placed above both said PLAs.

One remedy for this problem was described in U.S. Pat. No. 5,362,964 by adding a third scan coil between the two PLAs, but this impractical approach is clearly set apart from the present disclosures. The placing of an additional scan coil between the two PLAs in an ESEM of the prior cited art has not in practice remedied the problems associated with the prior art.

Furthermore, the inability to place all coils between the two PLAs in the prior art devices is due to the anticipated severe electron beam losses in the rough vacuum of the relatively large distance required to accommodate all scan coils therein.

In one approach, the embodiments of the present invention undertake the following steps to overcome the above limitations: Firstly, the scan coils are set and operate as in an SEM or low vacuum SEM but the PLA1 is placed at the end of the final lens and the PLA2 is placed above all the coils used. In other words, the entire set of scan coils (one, two or three) is placed between the two PLAs, which is initially contrary to established practice in ESEM. Now, to avoid the excessive electron beam loss anticipated in the area between the apertures, a much smaller PLA1 is used, which allows a much smaller gas leak from the specimen chamber. Thus, without increasing the pumping capacity between the two PLAs, the vacuum will be higher as the leak through the PLA1 becomes smaller. Thus the extra length travelled by the beam between the two PLAs is compensated by a proportionally better vacuum, and hence the beam does not suffer additional losses. At first sight, this might be thought to be an undesirable design because the PLA1 would be even more restricting the field of view on account of its smaller size. However, the smaller diameter aperture actually is compensated by eliminating the collimating effect of the double aperture as scan coils are situated between the apertures. The elimination of collimating allows an increased field of view without initially any modification to the electron optics design of certain existing instruments.

Furthermore, the elimination of the collimating effect allows the shifting of the pivot point so that the beam is allowed to scan an even larger base cone at the specimen. By such means, the scanned base of the cone is several times larger than the PLA1, thus achieving a large field of view, in effect, larger field of view than in prior art ESEMs.

The actual improvement of the field of view depends on the specimen positioning below the PLA1. At the lower range of pressures, the specimen can be placed relatively far from the PLA and the field of view is very large. As the pressure is raised in the specimen chamber, the specimen should be placed closer to the PLA1 with concomitant reduction of the field of view but nevertheless larger than the diameter of PLA1. Ultimately, at extremely high pressure the specimen should be so close to the PLA1 that the field of view will be again limited by the size of the aperture. However, there exists a useful range of pressure that allows a clearly larger field of view over prior art of ESEM for the same range of pressure.

In another approach, the embodiments of the present invention rely on the discovery of the relationship between (a) the amount of electron beam loss due to scattering by the supersonic gas jet and shock waves naturally formed above the PLA1 and (b) the distance between the two PLAs. By use of a modern computer simulation technique of the gas flow, it has been found that the electron beam loss is constant as the distance between the two apertures is varied, provided the gas exhausts in vacuum. In other words, an increase of the distance between the two apertures does not increase the electron beam loss, provided that the residual back pressure due to the pump used is sufficiently low. Any residual back pressure due to the pump will add a fraction of electron loss in proportion to the distance and the residual pressure, as anticipated by prior art. This discovery now of the constancy of electron beam loss teaches that (a) the minimum distance between the apertures to be used is that which is required to allow convenient placement of scan coils and (b) to choose the minimum pump speed that does not add any significant electron loss due to back pressure above the constant amount of loss disclosed herewith.

Alternatively, the new discovery teaches that (a) the minimum distance between the apertures to be used is that which is required to allow convenient placement of scan coils, (b) the minimum practically possible PLA1 is to be chosen that minimises the electron beam loss due to the supersonic jet and shock waves and (c) the minimum pump speed is to be chosen so that the maximum intermediate pressure obtained combined with the supersonic speed and shock waves do not result in excessive amount of electron beam loss that renders the probe spot unusable.

In practical terms, the new discovery and inventive steps of the present invention are materialised in the preferred embodiments by (a) placing scan coils between two pressure limiting apertures, (b) placing one of the two apertures at the end of the final lens or beyond, (c) making the distance of the two apertures as small as practical, (d) pumping the space between the two apertures with a pump that adds only a very low background gas pressure which added to the supersonic jet and shock waves naturally forming do not scatter the electron beam out of its useful intensity, (e) choosing the size of the final aperture not too small as to interfere with the electron optics forming a useful probe and not too large as to create destructive supersonic jet and shock waves and (f) adjusting the electron optics components to operate at optimum efficiency.

The ESEMs of the preferred embodiments are generally capable to operate at pressures sufficient to maintain saturation water vapour pressure in the specimen chamber, namely, pressures greater than 609 Pa. Therefore, pressures below 609 Pa are clearly also feasible in an ESEM, so that the embodiments of the present invention are also applicable in the so called low vacuum or variable pressure region at any level below the threshold of 609 Pa.

Now, an ESEM is useful if it can sustain at least 609 Pa, which is the minimum saturation vapour pressure of water in its liquid phase at zero degrees Celsius. At higher or room temperature the saturation water vapour pressure is higher. For a practical pressure range up to 1000–2000 Pa, it can be shown that the pressure-distance relationship in the specimen chamber is such that the field of view obtains a substantial improvement with the present invention over and above that sustained by the prior art of ESEM. Therefore, it should be appreciated that the present disclosure is in clear departure from the practice and understanding of prior art.

In yet another approach, and bearing in mind the disclosures made hereinabove, a further embodiment of the present invention undertakes the following alternative steps to overcome the limitation of field of view of prior art and to further increase the useful range of specimen chamber pressure: A third pressure limiting aperture (PLA3) is positioned at a very short distance from the first aperture (PLA1), whilst scanning coils are placed between PLA3 and previous second aperture (PLA2). The distance between the closely spaced apertures is of the order of magnitude of the PLA1. However, the diameter of the PLA3 is suitably smaller than that of PLA1 in order to avoid excessive amount of gas ejected through it. The space between PLA1 and PLA3 is evacuated by pumping means. Because, the PLA3 is very close to the PLA1, there is no collimating effect on the electron beam by the combination of first and third aperture. With such condition, the scan coils can deflect the electron beam via the PLA3 within a wide base cone allowed by the much larger PLA1 subtending a large solid angle at the PLA3. Thus, the interplay of size and short distance of two PLAs placed on one side of scan coils provides another improvement not practiced in the prior art of ESEM.

In an another aspect of the preferred embodiments of the present invention, the placement of two apertures at a very short distance as disclosed hereinabove results in improvement of the pumping capacity required. Based on gas dynamical studies of the gas flow between two apertures, it has been found that the velocity of the gas achieved after it passes the PLA1 can be used to advantage. This high velocity gas downstream of the PLA1 can be used to push back the background gas towards the input of the pump. As a result, a smaller capacity pump is required to create only a very rough vacuum. This advantage is only obtained when the distance is suitably short, generally less than a few diameters of PLA1. Clearly, this additional advantage was not disclosed or envisaged in the prior art, because the conditions used in prior art did not pertain to this advantage of improved pumping.

The placement of the two apertures at very short distance provides an improved field of view over the prior art of ESEM without initially any modification to certain existing designs of electron optical systems. However, an even further improvement of the field of view and improved overall performance is achieved by re-designing the electron optics to shift the pivot point as close as possible to the closely spaced apertures.

A further embodiment of the present invention anticipates a variable position of the pivot point above the PLA1 operating singly or in combination with PLA3.

The embodiments of the present invention do not initially require modifications to most existing electron optics systems but best results are achieved if those electron optics systems are adjusted to best accommodate the disclosures of the present invention. Adjustments may be effected with regard to position and control of scanning coils and the thereby arising effective pivot point of the scanned beam. Adjustments may be effected also with regard to position and control of probe forming apertures that determine the properties of the scanned probe spot. Further adjustments may be effected with regard to incorporating differential pumping inside the electron optics components in accordance with the disclosures of the present invention. It will be appreciated that these and other adjustments of the electron optics systems for the purpose of integrating the present invention with optimised electron optics systems do not constitute departure from the spirit of the present invention.

In yet further embodiments of the invention, the improved ESEM employs alternative means for signal detection in the gaseous environment of the specimen chamber. An electrostatic field is generated above the specimen surface under examination, so that an electron avalanche discharge ensues accompanied by a photon avalanche in the gas according to prior art. The electron and photon avalanches are initiated by the slow secondary electrons (SE) and the fast backscattered electrons (BSE) emanating from the beam-specimen interaction. With a suitably shaped electrostatic field, the SE are mainly concentrated in an inner cylindrical portion of the gas around the optical axis, while the BSE act mainly in the annular portion of the gas surrounding the inner cylinder. Clearly, there is an overlapping annular portion between the regions where there is a substantial mixture of the two signals. The relative size and distribution of signals is a function of gas pressure and applied potential for a given gas. This description of signal detection pertains to prior art.

Now, the embodiments of the present invention in relation to signal detection consists of using fine optical fibres or light pipes with a narrow or collimated input aperture in conjunction with a very fine needle biased electrode, in order to separate the SE signal from the BSE signal in a satisfactory manner. The needle tip is generally thin and the electrostatic field has its maximum intensity only within a few diameters from the tip. The volume around the specimen is only weakly affected by this field, so that the detection volume thereby is used only to collect the ionising signals without initially creating additional ionisation from the applied field of the needle tip. When the electrons enter in the strong field around the neighbourhood of the tip, they acquire enough energy to ionise the gas and multiply. Because of thermal energy and diffusion, the electrons do not finish their travel onto the tip of the needle before they undergo a significant number of random oscillations within the neighbourhood of the tip. Thus, every electron is multiplied accordingly within a small volume whereby the photon avalanche also forms. This controlled and limited signal volume is utilised by embodiments of this invention to both achieve high gain and separation of signals. The light so collected is used to analyse and display the corresponding signals in the usual manner.

Increased efficiency of signal collection is achieved if more than one needle electrodes are used, in order to capture those electrons that can thermally diffuse away from the weak field without entering the strong field around a single needle tip. Two or four such needles interconnected, or not, are generally sufficient to capture the majority of SE and subsequently amplify them.

In other embodiments of this invention, the use of optical fibres is necessitated from the fact that as the pressure is raised in the specimen chamber pressure, the range of SE is restricted to a smaller and smaller volume around the optical axis, whilst the action of the BSE remains expanded with an increased photon multiplication. Optical fibres, thin light pipes, or collimated light collectors that limit their photon input only from the desired excitation volume inside the gas are used. Collimation of the light pipes and selection of the detection volume is achieved by known means of guard or shade walls at the input of the light pipes.

In another embodiment of the present invention concerning signal detection, a relatively large diameter light pipe is configured to collect light from the volume of the gas excited only or mostly by the BSE signal. The BSE generate light in the gas through the dissipation of their own initial energy. In addition, the BSE generate further photon amplification via the avalanche process if an electric field is added in the volume acted by the BSE. The light so collected is used to analyse and display the corresponding signals in the usual manner.

In yet another embodiment of the present invention concerning signal detection, it is the electric pulse induced and picked up by the needle itself that is used to display an image and to do analysis.

In a further embodiment of the present invention, multiple optical fibres and light pipes in conjunction with electrically biased electrodes are used in the detection, amplification and separation of signals.

These and further objectives of the invention will become apparent from the following description of the preferred embodiments of the present invention as illustrated in the accompanying drawings.

BEST MODES FOR CARRYING OUT THE INVENTION

To assist with understanding of the invention, reference will now be made to the accompanying drawings, which embody some examples of the invention.

Figure 1:
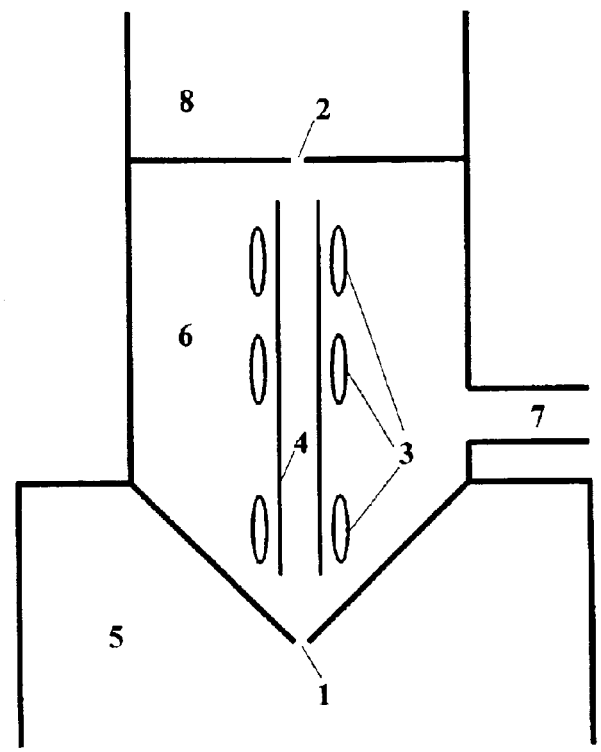
FIG. 1 is a diagram of the relative position of scan coils between two pressure limiting apertures as used in a device of a preferred embodiment of the present invention.

One embodiment of a device of the present invention is shown in FIG. 1. An electron or ion beam is generated, focussed and scanned by an electron optics column by known means, the relevant parts only of which are drawn in said FIG. 1. Apertures 1 and 2 are shown with scan coils 3 being positioned between. The aperture 2 is the entry port for the beam from the upper electron optics column (not shown) containing an electron/ion gun and other electromagnetic lenses, apertures and pumping means according to known art. The beam travels through column liner pipe 4 and exits via the aperture 1 into a specimen chamber 5. An intermediate chamber 6 is located in the space between the apertures 1 and 2 is evacuated via port 7 with a pump (not shown). The column liner 4 freely communicates with the space in the intermediate chamber 6 at its low end and also at the top and/or middle part e.g. via holes (not illustrated). An evacuation path of the port 7 allows operation of the device at relatively high specimen chamber pressure but it is not necessary at low specimen chamber pressure. The amount of pumping depends on the type of electron gun used and the level of high vacuum required thereto. The beam is deflected by the scan coils 3 in the x-y direction, normal to the beam axis, along raster lines on the specimen surface so that the beam probes an area inside the specimen chamber 5 much larger that the size of aperture 1. The size of probed (i.e. scanned) area over a specimen (not illustrated) depends on the effective position of the pivot point of the used beam.

The number of scan coils 3 can be one, two or three in accordance with common practice but all of the scan coils are practically placed between the apertures 1 and 2. The aperture 2 acts as a pressure limiting aperture to create a substantial pressure difference between the intermediate chamber 6 and the high vacuum chamber 8 where the beam is generated, but can also act as a spray or probe forming aperture according to known art. The aperture 1 acts primarily as a pressure limiting aperture to create a substantial pressure difference between the intermediate chamber 6 and the specimen chamber 5, but can also act as spray or probe forming aperture. Pressure greater than 609 Pa is allowed in the specimen chamber 5. A supersonic gas jet forms above aperture 1 whereby this supersonic gas jet dissipates its kinetic energy by collision with molecules of the background gas in the intermediate chamber 6 and by collision with walls in the chamber 6. By result of the collisions, shock waves form in the background gas and in front of the walls in the intermediate chamber 6, the intensity of which depends on the pressure of the background gas, on the distance of the encountered walls from aperture 1, on the diameter of the aperture 1 and on the pressure of gas in the specimen chamber 5.

Figure 2:
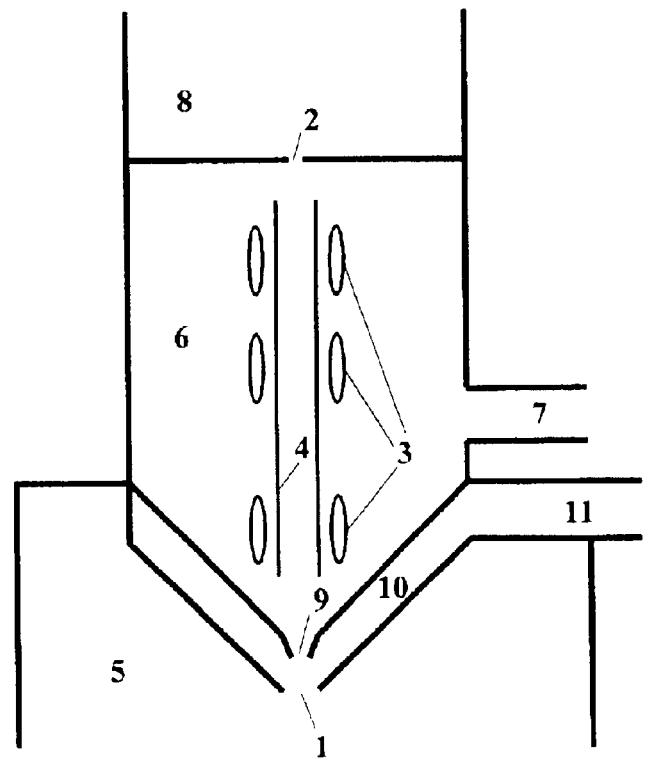
FIG. 2 is a diagram of the relative positions of scan coils and two closely placed pressure limiting apertures on one side of the coils of another embodiment.

Another embodiment of the invention is shown in FIG. 2. The description is identical as per FIG. 1 with an additional aperture 9 placed at close range from the aperture 1. The distance between the aperture 1 and the aperture 9 is only a few diameters of aperture 1, which is within the range of action of the supersonic jet formed by the aperture 1. This aperture positioning allows the beam to be deflected by the scan coils 3 in the x-y direction so that the beam probes an area inside the specimen chamber 5 much larger that the size of the aperture 1. The aperture 9 acts primarily as a molecular skimmer that allows only the central core fraction of the gaseous supersonic jet formed by the aperture 1 to escape into the intermediate chamber 6. The majority of gas outside the central part of the jet forces itself into an evacuation chamber 10 wherefrom it is removed via port 11 by a pump (not shown). The configuration of FIG. 2 allows an even higher pressure in the specimen chamber 5 than the configuration of FIG. 1.

Figure 3:
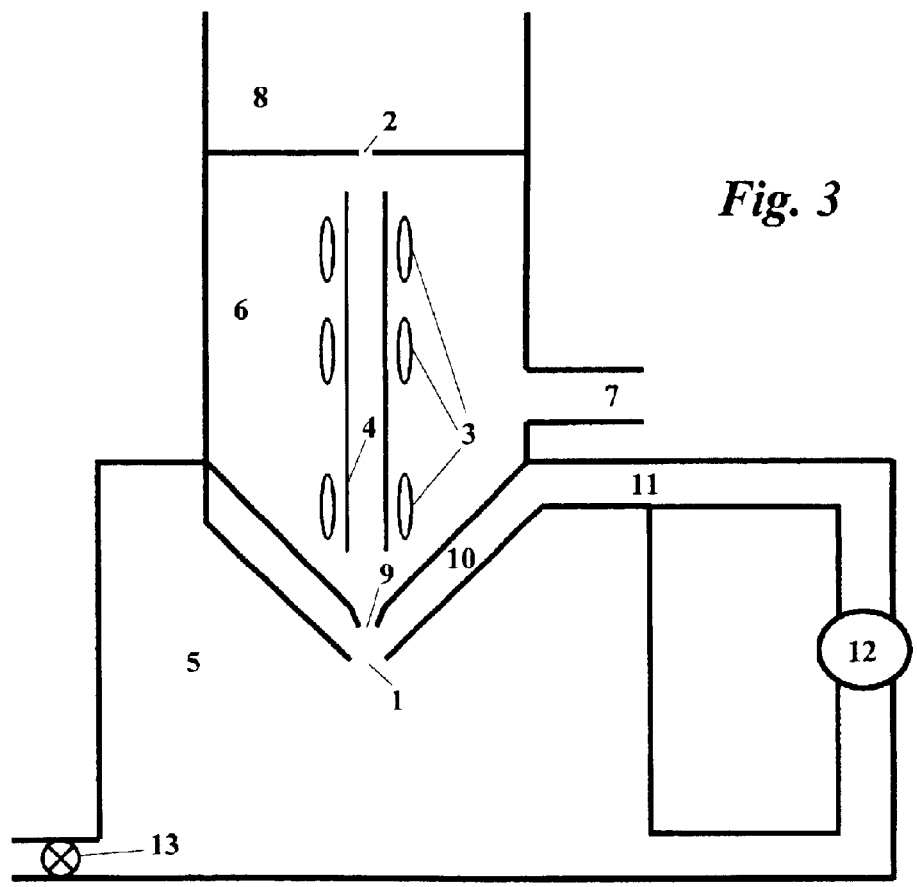
FIG. 3 is a diagram of a differential pumping system used in another embodiment.

One preferred embodiment of the pumping arrangement for the present invention is shown in FIG. 3. The port 11 is preferably evacuated with a pressure differential or compression pump 12 such as a molecular drag pump. Advantage is taken of the fact that this type of pump exhausts in the specimen chamber 5 so that the pump 12 must only overcome the pressure difference between the specimen chamber 5 and the evacuation chamber 10 instead of the difference between the evacuation chamber 10 and the atmosphere. This is a new improved approach because the pumping means acting on the intermediate chamber in the prior art exhaust in the atmosphere. It should be appreciated that the pump type and configuration in FIG. 3 is optional and does not limit the objectives and advantages of the invention disclosed in all other aspects of the invention. However, this option constitutes an additional improved embodiment of the present invention. The specimen chamber pressure is maintained at any desired level via a regulating valve system 13 which opens or closes to admit gas in the chamber 5 or to pump gas out of the chamber 5, in a manner that stabilises the pressure level or varies the pressure to a different level.

Referring now to FIGS. 1, 2 and 3 a similar preferred embodiment of the pumping arrangement (not shown) is by incorporating a compression type pump with its input connected to port 7 to draw gas from the chamber 6 and its output connected to exhaust gas into specimen chamber 5.

Referring again to FIG. 3, a similar preferred embodiment of the pumping arrangement (not shown) can be used to create a pressure difference between the intermediate chamber 6 and chamber 10, by using a differential or compression pump drawing gas from the intermediate chamber 6 and exhausting into the chamber 10.

Referring yet again to both FIGS. 1 and 2, similar compression type of pumps can be used between additional pumping chambers along the electron optics column, namely, by connecting the pumping means between any two of the chambers 5, 10, 6, 8 and the additional chambers.

The idea of using compression type of pumps between stages as disclosed herewith requires much smaller size pumps. The use of miniature type pump has only become possible in the embodiments of the present invention, which teaches means for minimal pump requirements. The use of this type of pump has been excluded from all prior art in electron microscopy because of the high pumping capacity generally required in electron microscopy. Therefore, the incorporation of a generally small size vacuum pump in the manner disclosed herewith is an improvement over known devices. Embodiments of this idea can be implemented by various combinations and pump designs acting by compression action between stages.

Referring yet again to FIG. 3, the pressure differential pump 12 is a thermal transpiration-driven vacuum pump, which has some unique advantages. The thermal transpiration-driven vacuum pump has no mechanical moving parts and hence has no mechanical vibration and noise, which generally deteriorate the image and resolution. This type of pump can be integrated with the instrument interfaces in a most effective, space and cost saving configuration. The use of this type of pump has only become possible in the present invention, which teaches means for minimal pump requirements. The use of this type of pump has been excluded from all prior art in electron microscopy because of the high pumping capacity generally required in electron microscopy. Therefore, the incorporation of a thermal transpiration-driven vacuum pump in the manner disclosed herewith is an improvement.

Figure 4:
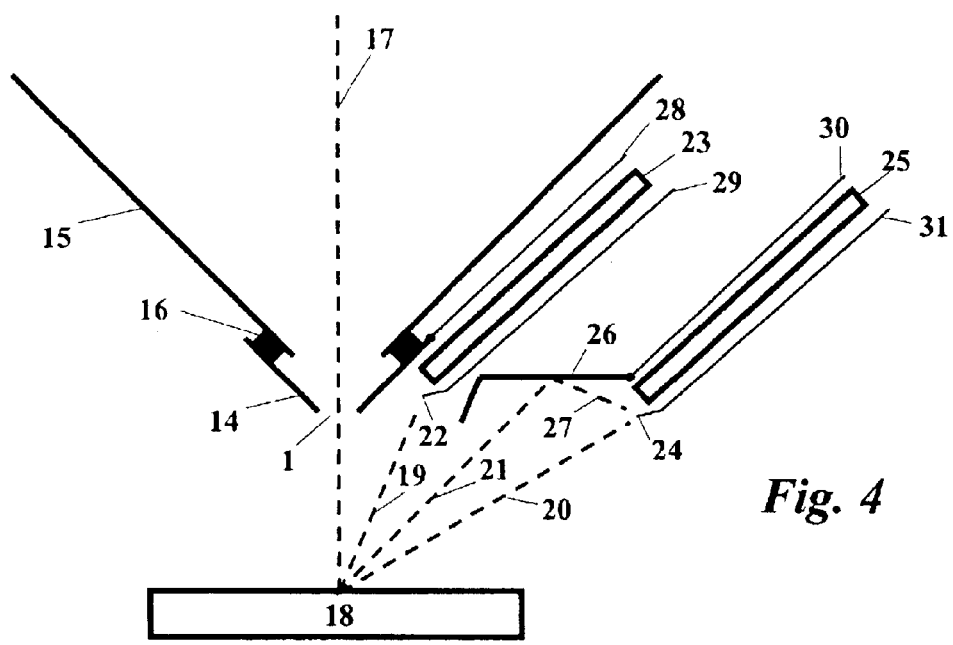
FIG. 4 is a diagram of a detection system with light pipes and needle electrodes used in a further embodiment.

One preferred embodiment of the signal detection in the present invention is shown in FIG. 4. The pressure limiting aperture 1 is identical as in previous drawings except for the detail whereby an aperture electrode 14 of the material at the aperture 1 is insulated from the remainder of a wall 15 of the aperture 1 by insulating material 16 which allows the application of an electric potential on the material of the tip 14 independently of the potential applied on the material of the wall 15. The instrument beam (now illustrated) and referenced as 17 passes through the aperture 1 and strikes the specimen 18 (now illustrated) and referenced as 18 under examination inside a gaseous envelope maintained by the specimen chamber 5. The beam 17 interacts with the specimen 18 and various signals emanate, in accordance with specimen properties, from every pixel (point) element scanned by the beam probe 17. The signals are low energy secondary electrons 19 and high energy backscattered electrons 20 and 21. The secondary electrons 19 are generally confined in the inner portion of gas environment around the incident beam 17 and are acted upon by the electric field generated by the applied potential on a tip of a needle electrode 22. The electric field first gathers the secondary electrons 19 towards the tip of the needle electrode 22 followed by electron gaseous amplification in an avalanche form in the confined region surrounding the tip. The electron avalanche is accompanied by a photon avalanche from the excited and ionised gas molecules, the light of which is collected by optical fibres or light pipe 23 directed towards the luminous avalanche region. The light pipe 23 is connected to light sensors (not shown) wherefrom the information about the specimen 18 is recorded according to known art. The potential of needle electrode 22 is generally higher than the potential of aperture electrode 14 and of the potential of the specimen 18 so that the secondary electrons 19 are directed towards the tip of the needle electrode 22. The potential of electrodes 14 and 22 is variable and is chosen in accordance with the pressure in the specimen chamber 5 and in accordance with signal control desired by the operator.

Another preferred embodiment of the signal detection of the present invention is shown also in FIG. 4. Similar to the detection of secondary electrons 19 described hereinabove, the backscattered electrons 20 and 21 traverse a generally large volume of gas outside the region of the volume occupied by the secondary electrons 19. The backscattered electrons 20 and 21 ionise the gas producing a new generation of secondary electrons from the gas molecules with which they collide. This new generation of electrons are acted upon by the electric field of electrode 24 and multiply in an avalanche form inside the gas, accompanied by a light avalanche in a fashion similar to that described hereinabove. The light so produced is collected by a light pipe 25 or equivalent optical fibres which are connected to light sensors (not shown) wherefrom the information about the specimen is recorded according to known art. An electrode 26 is biased and shaped so that the electric field separates and gathers the ionisation and photon products of the backscattered electrons 20 and 21 towards the electrode 24. The backscattered electrons 21 also strike the electrode 26 and other surrounding walls wherefrom yet another generation of secondary electrons is formed, known as "converted backscattered electrons" in prior art. The latter generation of secondary electrons are also acted upon by the field established by the electrodes 24 and 26, by the specimen 18 and other surrounding walls, and are multiplied in an avalanche form to generate additional electrons 27, and photons also collected by the light pipe 25. The potential of electrodes 24 and 26 is variable and is chosen in accordance with the pressure in the specimen chamber 5 and in accordance with signal control desired by the operator.

It should be appreciated that FIGS. 1, 2, 3 and 4 do not restrict the scope and design of the present invention. Various parameters can vary to obtain a different information in different applications. It will be apparent to those skilled in the art that various changes and modifications may be made therein without departing from the spirit of the invention.

The scan coils 3 shown in FIGS. 1, 2 and 3 are optimally designed according to known art in a fashion meeting the requirements and objectives of the present invention. This invention does not restrict the number and configuration of the scan coils 3. The coils 3 are designed and configured to occupy the shortest possible distance along the beam axis and generate an effective or apparent pivot point as close as possible to the beam exiting aperture 1. A person skilled in the art chooses the appropriate number of turns, size, position and electric current through said coils in conjunction with a given electron optical lens to achieve the set objectives and requirements.

It should be appreciated that to place the entire set of scan coils 3 between the two pressure limiting apertures 1 and 2 eliminates the collimating effect of previous art. This requirement should not be construed to mean that no part of any coil should be on the plane or partly crossing the plane of any of the two apertures 1 and 2, provided always that no collimating effect arises therefrom. Such variations, if implemented during the electron optical design, should by no means be interpreted as departing from the spirit and scope of the present invention.

It should also be appreciated that the scope of the present invention is not limited by the particular type of electron optics used to implement the teachings herewith. Generally speaking, the existing electron optics designs can be integrated with the disclosures of this invention. However, better and improved results are obtained by re-designing the existing electron optics to optimally accommodate the requirements of the present invention.

One such improvement of electron optics is to shift the pivot point of the scanned beam as close as possible to the final pressure limiting aperture.

Another improvement of the electron optics is to provide the facility to vary the position of the pivot point along the axis of the system.

Any particular embodiment of the teachings of the present inventions via various electron optical designs does not depart from the scope and spirit of the invention.

The column liner 4 shown in FIGS. 1, 2 and 3 should also have the shortest possible length and should have vents wherever possible so that no pressure gradients are formed along its length. The column liner 4 can also be eliminated wherever possible to allow optimum gas conductance, and exhaust through the port 7. These design details will ensure minimal beam losses along the travel distance therein, the losses being equal or close to the constant amount predicted by the relationship disclosed by the present invention.

The aperture 9 shown in FIG. 2 is preferably shaped to provide a lip facing the incident supersonic jet issuing from the aperture 1. The lip direction is generally along the direction of the flow lines of the gas jet issuing from the aperture 1 so that a shock wave is suppressed or prevented from forming in front of (i.e. upstream) the aperture 9. The latter feature is known in the art of skimmer design in molecular beam technology and can be used to advantage in the ESEM of the embodiments of present invention. The elimination or suppression of a shock wave reduces the amount of gas leak through aperture 9. It should be appreciated that these and similar improvements can be incorporated in the arrangement of an ESEM herein disclosed without departing from the spirit of the invention.

Referring again to FIG. 4, the light pipe 25 is generally of a much larger diameter than the optical fibres or light pipe 23, because the volume acted upon by the backscattered electrons is considerably larger. However, bundles of optical fibres can be combined to achieve an equivalent result. The light pipes and optical fibres used are preferably tilted as shown in the drawing in order to freely move and tilt the specimen in the chamber 5. The tilted light pipes also facilitate light collimation in order to more closely separate light from different detection volumes in the gas. However, horizontal direction of the light pipes may also be implemented without departing from the scope and spirit of the present invention.

It should be appreciated that more than one optical fibres and more than one light pipes with corresponding biased electrodes can be used inside separate detection volumes in order to detect signals emanating in different directions. Specifically with regard to the detection of backscattered electrons, two or four light pipes can be used in pairs to detect backscattered electrons in all directions by combining the output of said light pipes according to known art.

However, any number of light pipes and any number of biased electrodes can be used to allow maximum flexibility regarding signal amplification, separation and filtration.

Referring yet again to FIG. 4, the various electrodes such as 14, 22, 24, and 26 are connected via appropriate wiring 28, 29, 30 and 31 to power supplies and electronics amplifiers and controls according to known art. The connections and cables are biased to shape the applied potential in the desired direction, to provide electrostatic and electromagnetic guarding and to prevent "cross-talking" of the information from one channel to the next. The geometry of electrodes further allows shading, light collimation, shielding and separation of one detection volume from another.

The embodiments disclose the use of a needle to generate electron amplification in the gaseous medium of an ESEM, so that the use of the electric pulse in the needle alone can be used to display information from the specimen. This mode of detection may be preferred in particular applications.

The needle type of electrode can also be used inside a static or alternating magnetic field arising either from the focussing action of lenses or from the purposeful introduction of electromagnetic field sources to further control the electrons and ions generated inside the gaseous volume of the detector.

The embodiments of the present invention can also be used with other prior detection art such as with low bias electrodes not producing an avalanche type of signal amplification. It has been shown by prior art that it can be sufficient to collect the specimen secondary electrons and associated products even with a low bias electrode. Similarly, it has been shown that it is possible to collect the ionisation current and associated products created by the backscattered electrons in the gaseous envelope surrounding the specimen under examination by low bias electrodes.

Again, it will be apparent to those skilled in the art that various changes and modifications may be made therein to allow a combination and integration with other instruments without departing from the spirit of the invention.

INDUSTRIAL APPLICABILITY

The embodiments of the present invention apply generally to all instruments using a charged particle beam such as an electron and ion beam probe, which is generally scanned over a specimen surface. Such instruments comprise scanning electron microscopes, scanning transmission electron microscopes, electron beam micoanalysers, environmental scanning electron microscopes and ion/electron beam instruments as used in microelectronics industry for microfabrication. Electron beams are generated with different types of electron gun such as tungsten, lanthanum hexaborite and field emission gun, so that any of these beam sources can be used without departing from the spirit of the present invention. Likewise, the focussing of the beam is achieved with different type of electromagnetic lenses (electric or magnetic) so that use of any of such types will not be considered as a departure from the spirit of the present invention.

The applicability of the ESEM instrument is well established industrially, and any improvement of it will also serve in same and additional industrial applications.

The new ESEM disclosed by the present invention has the advantage of much improved field of view at low magnifications, which is a desired property during the examination of specimens.

Another advantage is the minimal loss of beam during transfer from the vacuum electron optics into the high pressure environment. Because a much smaller pressure limiting aperture is deliberately used in the embodiments of the present invention, the jet formed above the pressure limiting aperture is significantly smaller and hence significantly less electron or ion beam losses occur in the region above the aperture as opposed to the situation in prior art which prefers the use of large apertures. The lesser beam losses are also obtained by the better vacuum achieved along the electron beam path.

A further advantage is the improved signal-to-noise-ratio on account of better beam transfer conditions.

Another advantage is the higher pressure range that can be tolerated in the specimen chamber, because of the better separation of the vacuum electron optics from the specimen chamber.

An additional advantage is the more efficient pumping means disclosed by this invention.

The overall advantage of the present invention is the use of electron optical means and small pressure limiting aperture to compensate for a reduction of the required pumping capacity with concomitant increase of the field of view over the prior art of ESEM and prior art of low vacuum or variable pressure SEM.

Other advantages arise from the improved detection means disclosed in the embodiments of the present invention. The use of photons instead of the electrons used in the prior art has the advantage of minimum noise. The photons collected from the gaseous phase can be efficiently further amplified by a photomultiplier which has a much better time response than the electronics amplifiers used in prior art. A photomultiplier also requires simpler circuitry and can be more directly connected to the output display of the microscope.

A further advantage arises from the more efficient separation and amplification of signals in the gaseous medium of the specimen chamber.

A further advantage is with the use of the needle electrode principle to multiply and detect the electrons in the gaseous phase of the specimen chamber when detection is preferred by the use of electron current instead of photons.

What is claimed is:

1. A device using electron optical means for the generation and propagation of a focused charged particle beam transferred via two apertures from a high vacuum chamber into a low gas pressure specimen chamber with an intermediate pressure chamber there between, said apertures being aligned along axis of said beam, and characterized in that:
   (a) said beam is deflected and scanned by a set of scanning coils situated near said axis of said beam;
   (b) all of said coils being substantially between said two apertures;
   (c) amplitude of the deflection of said beam inside the specimen chamber is larger than the diameter of the aperture separating the specimen chamber from the intermediate pressure chamber;
   (d) the aperture separating the specimen chamber from the intermediate pressure chamber is located substantially at the end of the electron optical means, or away from the end of the electron optical means to allow a specimen to be freely placed without obstruction at any distance from the aperture
   (e) wherein the said aperture that separates the specimen chamber from intermediate pressure chamber incorporates a pair of apertures having additional pumping means evacuating the space formed between the said pair of apertures.

2. A device using electron optical means for the generation and propagation of a focused charged particle beam transferred via two apertures from a high vacuum chamber into a high gas pressure specimen chamber with an intermediate pressure chamber there between, said apertures being aligned along axis of said beam, and characterized in that:
   (a) said beam is deflected and scanned by a set of scan coils generally situated near said axis of said beam and being substantially between said two apertures;
   (b) amplitude of the deflection of said beam inside the specimen chamber is larger than the diameter of the aperture separating the specimen chamber from the intermediate pressure chamber;
   (c) the aperture separating the specimen chamber from the intermediate pressure chamber is located substantially at the end of the electron optical means, or away from the end of the electron optical means to allow a specimen to be freely placed without obstruction at any distance from the aperture
   (d) said intermediate pressure chamber is evacuated via port therein with an attached pump means characterized by a minimum speed sufficient to suppress the intermediate pressure to a level whereby the gas molecules of background gas together with gas molecules of a supersonic jet and shock waves, naturally forming between said two apertures, do not extinguish by scattering, said beam out of its useful intensity;
   (e) the aperture separating the specimen chamber from the intermediate pressure chamber is of sufficiently small geometry that allows the use of said minimum pump speed to suppress the intermediate pressure to a level whereby the gas molecules of background gas together with gas molecules of a supersonic jet and shock waves, naturally forming between said two apertures, do not extinguish, by scattering, the said beam out if its useful intensity;
   (f) the electron optics components are adjusted to operate at optimum efficiency, said electron optics components including but not limited to location, type and configuration of detectors, scan coils, probe forming aperture, spray apertures, pressure limiting apertures, column liners, objective lens, electron beam and aperture alignment, electron optics controls, materials, electronics and software
   (g) wherein the said aperture that separates the specimen chamber from intermediate pressure chamber incorporates a pair of apertures having additional pumping means evacuating the space formed between the said pair of apertures.

3. A device according to claim 2 wherein the aperture that separates the specimen chamber from intermediate pressure chamber is replaced by a pair of apertures characterized in that:
   (a) the apertures of the pair are substantially coaxial;
   (b) additional pumping means evacuates the space formed between the said pair of apertures;
   (c) either aperture of the said pair of apertures and the said additional pumping means may be removed.

4. A device according to claim 3 wherein either aperture of the said pair of apertures is moveable along the common aperture axis by appropriate means.

5. A device according to claim 3 wherein either aperture of the said pair of apertures is moveable in direction normal to the aperture axis by appropriate means that allow precise alignment of the aperture along a common axis.

6. A device according to claim 2 wherein an additional third aperture introduced between said two apertures and characterized in that:

(a) said third aperture is located within the range of action of the said supersonic gas jet;

(b) said third aperture skims central core of the supersonic jet formed by said first aperture so that only a small fraction of gas leaks into the intermediate chamber containing said scan coils; and (c) said supersonic jet forces majority of gas in the space between said first and third apertures wherefrom the gas is easier to remove by use of a small capacity pumping means.

7. A device according to claim 2 wherein said pumping means comprises a differential pressure pump exhausting into the specimen chamber.

8. A device according to claim 3 whereby the pumping means have their input and output connected between any two chambers.

9. A device according to claim 8 wherein any of said pumping means is a molecular drag pump.

10. A device according to claim 8 wherein any of said pumping means is a thermal transpiration-driven vacuum pump.

11. A device according to claim 3 whereby any of said apertures acts also as a probe forming or spray aperture.

12. A device according to claim 3 whereby effective or apparent pivot point of the scanned beam is located close to the aperture separating the specimen chamber from the intermediate pressure chamber.

13. A device according to claim 3 whereby effective or apparent pivot point of the scanned beam is movable along the electron optical axis.

14. A device according to claim 3 wherein detection means are introduced comprising:

(a) a needle electrode biased to attract the electrons generated in the gas by the emerging ionizing signals from beam-specimen interaction;

(b) said electrons multiplying in an avalanche form as approach said needle electrode; and (c) electric pulse being generated in said needle electrode by said multiplying electrons and recorded by appropriate means.

15. A device according to claim 14 whereby one of said ionizing signals corresponds to secondary electrons from the beam specimen interaction, and is used to make secondary electron images.

16. A device according to claim 14 whereby one of said ionizing signals corresponds to backscattered electrons from the beam specimen interaction, and is used to make backscattered electron images.

17. A device according to claim 3 wherein detection means are introduced comprising:

(a) a needle electrode biased to attract the electrons generated in the gas by the emerging ionizing signals from the beam-specimen interaction;

(b) said electrons multiplying in an avalanche form as approach said needle electrode and generating a photon avalanche; and (c) photons in said photon avalanche being collected via optical fibers or light pipes and recorded by appropriate means.

18. A device according to claim 17, wherein additional biased needles or other electrodes and additional optical fibers and light pipes are introduced to selectively detect various fractions of ionizing signals generated from different regions in the gas acted upon by different types of signals emanating from the beam-specimen interaction.

19. A device according to claim 18 whereby said optical fibers or light pipes collect photons corresponding to the secondary electrons emanating from the beam-specimen interaction.

20. A device according to claim 18 whereby said optical fibers or light pipes collect photons corresponding to the backscattered electrons emanating from the beam-specimen interaction.

21. A device according to claim 3 wherein detection means are introduced comprising a needle electrode biased with a variable voltage to attract the electrons generated from the beam-specimen interaction alone or in combination with ionization electrons from the gas, or to attract other ions from the gas ionized by various signals.

* * * * *